US012805240B2

(12) United States Patent
Sugimoto et al.

(10) Patent No.: US 12,805,240 B2
(45) Date of Patent: Nov. 17, 2026

(54) METHOD OF ADJUSTING HEAT UNIFORMITY ON WAFER MOUNT AND METHOD OF MANUFACTURING WAFER MOUNT

(71) Applicant: NGK INSULATORS, LTD., Nagoya (JP)

(72) Inventors: Hiroya Sugimoto, Chiryu (JP); Ikuhisa Morioka, Handa (JP); Keita Mine, Chita-Gun (JP); Ryuji Tamura, Nagoya (JP); Natsuki Hirata, Nagoya (JP); Yohei Kajiura, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 476 days.

(21) Appl. No.: 18/510,887

(22) Filed: Nov. 16, 2023

(65) Prior Publication Data

US 2024/0120216 A1 Apr. 11, 2024

Related U.S. Application Data

(63) Continuation of application No. PCT/JP2022/037254, filed on Oct. 5, 2022.

(51) Int. Cl.
*H10P 72/00* (2026.01)
*H10P 72/72* (2026.01)
*H10P 72/76* (2026.01)

(52) U.S. Cl.
CPC ...... *H10P 72/0432* (2026.01); *H10P 72/0602* (2026.01); *H10P 72/72* (2026.01); *H10P 72/7624* (2026.01)

(58) Field of Classification Search
CPC .. H10P 72/0434; H10P 72/0432; H10P 72/72; H10P 72/722; H10P 72/0602;
(Continued)

(56) References Cited

U.S. PATENT DOCUMENTS 11,569,073 B2 1/2023 Hirose et al.
2003/0030960 A1 2/2003 Kanno et al.
(Continued)

FOREIGN PATENT DOCUMENTS

JP H09-312281 A 12/1997
JP 2003-060019 A 2/2003
(Continued)

OTHER PUBLICATIONS

English translation of KR-101901551-B1 (Year: 2018).*
(Continued)

*Primary Examiner* — Chris Q Liu
(74) *Attorney, Agent, or Firm* — Muncy, Geissler, Olds & Lowe, P.C.

(57) ABSTRACT

A method of adjusting heat uniformity on a wafer mounting surface of a wafer mount having a ceramic base including the wafer mounting surface which can heat a wafer through energization and a cooling plate includes: a) preparing the wafer mount including the cooling plate including: a base including a flow path of a coolant; and a lid detachable from the base; b) measuring a temperature distribution with the lid being attached on the base while heating through the energization and cooling; c) detaching the lid and locally adjusting a shape of the flow path when the temperature distribution does not satisfy a predetermined criterion; and d) remeasuring the temperature distribution after adjusting the shape of the flow path, with the lid being attached on the base while heating through the energization and cooling, wherein the steps c) and d) are repeated until the remeasured temperature distribution satisfies the criterion.

10 Claims, 6 Drawing Sheets

(58) Field of Classification Search
CPC .... H10P 72/7612; H10P 50/242; H10P 72/70; H10P 72/7614; H10P 72/7624; H10P 72/0402; H10P 72/0431; H10P 72/7611; H10P 72/7616; H10P 72/7626; H10P 95/00
USPC ...................................... 219/121.68; 361/234
See application file for complete search history.

(56) References Cited

U.S. PATENT DOCUMENTS

| | | | | |
|---|---|---|---|---|
| 2006/0021705 | A1* | 2/2006 | Imai | C23C 16/4581<br>156/345.52 |
| 2014/0238609 | A1* | 8/2014 | Tomioka | H10P 72/0434<br>279/128 |
| 2019/0066985 | A1* | 2/2019 | Hirose | H01J 37/32715 |
| 2020/0407840 | A1 | 12/2020 | Hayashi et al. | |
| 2022/0216086 | A1* | 7/2022 | Ishikawa | B23Q 3/15 |
| 2022/0246451 | A1* | 8/2022 | Takebayashi | H10P 72/0432 |

FOREIGN PATENT DOCUMENTS

| | | | | | |
|---|---|---|---|---|---|
| JP | 2020-013931 | A | | 1/2020 | |
| JP | 2020-053576 | A | | 4/2020 | |
| JP | 6918642 | B2 | | 8/2021 | |
| KR | 101901551 | B1 | * | 9/2018 | H10P 72/0602 |
| WO | WO-2022168368 | A1 | * | 8/2022 | H10P 72/70 |

OTHER PUBLICATIONS

English translation of WO-2022168368-A1 (Year: 2022).*
International Search Report (Application No. PCT/JP2022/037254) dated Dec. 13, 2022 (2 pages).
English translation of the International Search Report dated Dec. 13, 2022 (Application No. PCT/JP2022/037254).

* cited by examiner

100

METHOD OF ADJUSTING HEAT UNIFORMITY ON WAFER MOUNT AND METHOD OF MANUFACTURING WAFER MOUNT

BACKGROUND OF THE INVENTION

Field of the Invention

The present invention relates to a wafer mount on which a wafer is fixed via electrostatic attraction, and particularly to a heat uniformity adjustment treatment on the wafer mount.

Description of the Background Art

Wafer mounts (also referred to as "wafer stages", etc.) on each of which a semiconductor wafer (hereinafter also simply referred to as a "wafer") is fixed via electrostatic attraction in a predetermined treatment to the wafer such as a plasma treatment have already been known (see, for example, Japanese Patent Application Laid-Open No. 2003-60019 and Japanese Patent No. 6918642).

Each of the known wafer mounts generally has a structure in which a ceramic base and a cooling plate (also referred to as a "base", etc.) are bonded together through a bonding layer. In the ceramic base, an electrostatic chucking electrode (ESC electrode) for electrostatically attracting a wafer, and a heater electrode for heating the wafer are buried. The cooling plate includes a flow path through which a coolant for cooling the ceramic base passes.

When a DC voltage is applied to the ESC electrode with a wafer being disposed on a mounting surface that is an upper surface of the ceramic base, the wafer is fixed via electrostatic attraction on the wafer mount. At the same time, the wafer is heated to have a predetermined temperature distribution (a temperature uniformity distribution) set in advance by energizing the heater electrode while causing the coolant to flow through the flow path inside the cooling plate.

A desired temperature distribution on the aforementioned wafer mount is normally secured by providing the heater electrode in the wafer mount to obtain a heat density matching a heat extraction distribution.

The heat extraction distribution on a wafer mount, however, differs for each wafer mount depending on error factors when manufactured, such as thickness variations in bonding layer and machining accuracy in cooling plate. Furthermore, variations in shape (e.g., cross-sectional area and width) of heater electrode from designed one sometimes cause failures in having intended heat densities. Due to these factors, the temperature distribution on a wafer plane fixed to a wafer mount may differ for each wafer mount. In some cases, a wafer mount that cannot obtain a desired temperature distribution may be manufactured.

Thus, wafer mounts with conventional structures have limitations in improving the manufacturing yields.

SUMMARY

The present invention relates to a wafer mount on which a wafer is fixed via electrostatic attraction, and is particularly directed to a heat uniformity adjustment treatment on the wafer mount.

A wafer mount according to the present invention includes: a ceramic base which includes the wafer mounting surface and in which an electrostatic chucking electrode and a heater electrode are buried; and a cooling plate bonded to the ceramic base and including a flow path of a coolant, wherein the wafer mount is configured to perform heating through energization to the heater electrode and cooling by cyclically supplying the coolant to the flow path, with the wafer being fixed on the wafer mounting surface via electrostatic attraction through application of a voltage to the electrostatic chucking electrode.

A method of adjusting temperature uniformity on the wafer mounting surface of the wafer mount according to the present invention includes the following steps: a) preparing the wafer mount including the cooling plate including: a base bonded to the ceramic base and including the flow path; and a lid detachable from the base and allowing opening of the flow path when being detached from the base; b) measuring a temperature distribution on the wafer mounting surface with the lid being attached on the base while performing the heating through the energization and the cooling; c) detaching the lid from the base and locally adjusting a shape of the flow path when the measured temperature distribution does not satisfy a predetermined criterion; and d) remeasuring the temperature distribution on the wafer mounting surface of the wafer mount in which the shape of the flow path has been adjusted in the step c), with the lid being attached on the base while performing the heating through the energization and the cooling, wherein the step c) and the step d) are repeated until the temperature distribution remeasured in the step d) satisfies the predetermined criterion.

According to the invention, the temperature distribution can be improved by detaching the lid and adjusting the shape of the flow path, when the temperature distribution on the mounting surface does not satisfy a predetermined criterion. Since this enables the adjustment of the temperature distribution on the wafer mount that has been manufactured, the manufacturing yields of the wafer mounts can be improved.

Thus, the object of the present invention is to provide a method of enabling adjustment of temperature uniformity on a wafer mounting surface of a wafer mount after the wafer mount is manufactured.

These and other objects, features, aspects, and advantages of the present invention will become more apparent from the following detailed description of the present invention when taken in conjunction with the accompanying drawings.

DESCRIPTION OF THE PREFERRED EMBODIMENTS

[Wafer Mount]

Figure 1:
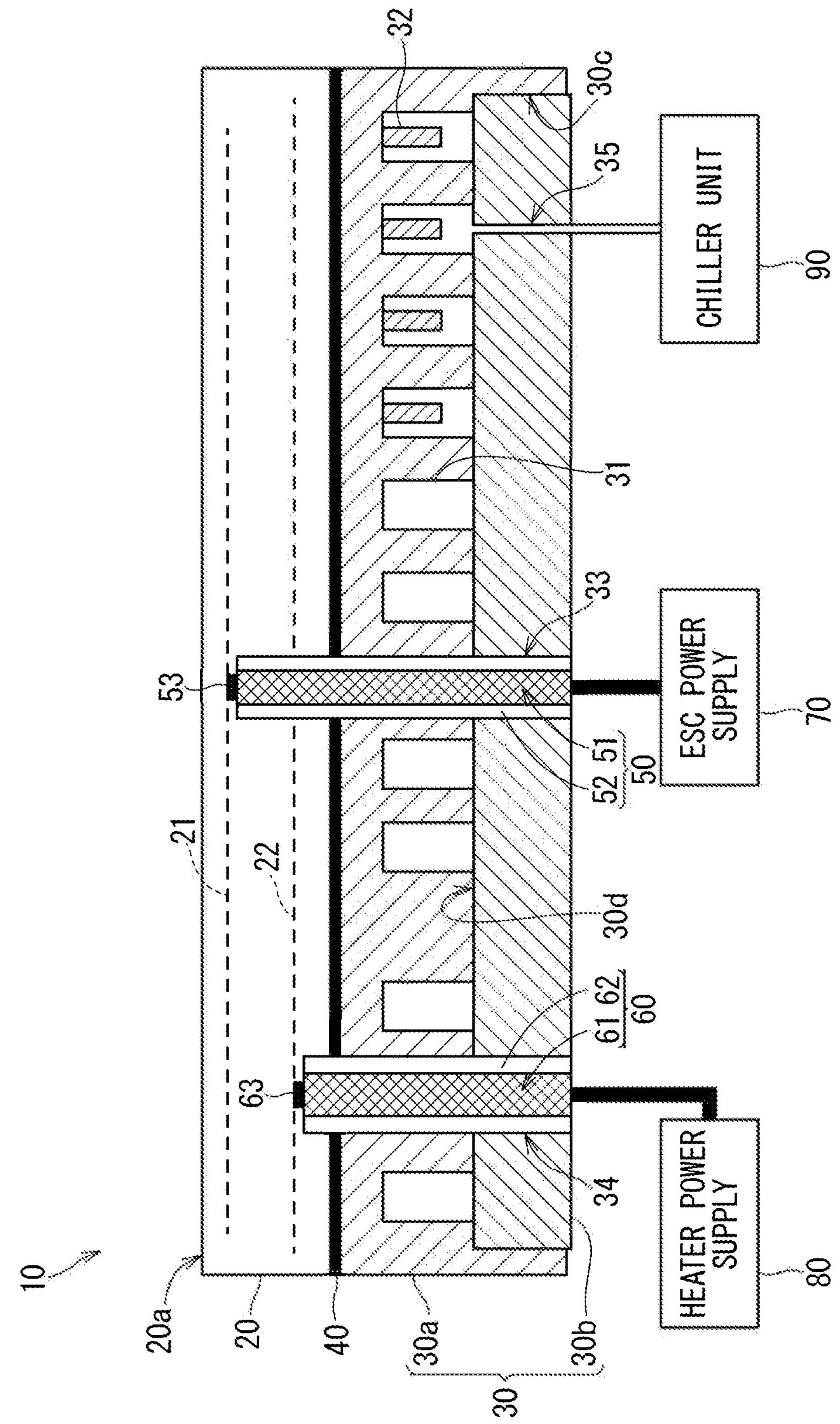
FIG. 1 is a schematic cross sectional view illustrating a structure of a wafer mount 10.

FIG. 1 is a schematic cross sectional view illustrating a structure of a wafer mount 10 subjected to a method of heat uniformity adjustment treatment according to an embodiment of the present invention. The wafer mount 10 is a mount for fixing a semiconductor wafer (wafer) via electrostatic attraction while heating the wafer to have a predetermined temperature distribution when a predetermined treatment such as a plasma treatment is applied on the wafer.

The wafer mount 10 generally has a structure in which a ceramic base 20 is stacked on a cooling plate 30 with the ceramic base 20 and the cooling plate 30 being bonded together through a bonding layer 40.

The ceramic base 20 is a disc-like member made of an insulating ceramic such as $Al_2O_3$ or AN. In the ceramic base 20, a main surface opposite to a bonded surface to the bonding layer 40 is a mounting surface 20*a* on which a wafer is mounted.

In the ceramic base 20, an electrostatic chucking electrode (ESC electrode) 21 for electrostatically attracting a wafer, and a heater electrode 22 for heating the wafer are buried. The ESC electrode 21 is buried closer to the mounting surface 20*a* than the heater electrode 22.

Exemplifications of materials of the ESC electrode 21 and the heater electrode 22 include metals such as W, Mo, Ti, Si, and Ru, and carbide and nitride thereof.

The cooling plate 30 includes a flow path 31. The flow path 31 is a part for cooling the ceramic base 20 and further a wafer fixed to the mounting surface 20*a* via electrostatic attraction, through external introduction of a coolant (e.g., water) to the flow path 31. A preferable example of the flow path 31 is a continuous groove formed in a spiral shape in a plan view so that almost an entire region of the ceramic base 20 is cooled. Alternatively, the flow path 31 may include a plurality of independent grooves each having an open ring shape and concentrically arranged in a plan view.

Specifically, the cooling plate 30 includes a base 30*a* and a lid 30*b*. The base 30*a* is bonded to the ceramic base 20 through the bonding layer 40 on the main surface side (upper in the drawing perspective), and includes, on the other main surface side (lower in the drawing perspective), a recess 30*c* in which the lid 30*b* is engaged, and the flow path 31 that is a groove dug further from the recess 30*c*. Although the lid 30*b* is engaged in the recess 30*c* formed in the base 30*a* and is fixed to the base 30*a* through screws, which are not illustrated, at a plurality of portions, unscrewing the screws can detach the lid 30*b* from the base 30*a*. In other words, the lid 30*b* is detachable from the base 30*a*.

When the lid 30*b* is fixed to the base 30*a*, a sealant may be disposed between the base 30*a* and the lid 30*b* to prevent leakage of the coolant. Exemplifications of the sealant include a liquid gasket and an O-ring.

As long as the lid 30*b* is fixed to the base 30*a*, the flow path 31 is closed by a main surface 30*d* of the lid 30*b*. Removing the lid 30*b* by the unscrewing can open the flow path 31. Thereby, detaching the lid 30*b* allows access to the flow path 31 even after the completion of the wafer mount 10 according to the embodiment.

Although the cooling plate 30 is preferably made of a metal such as aluminum, it may be made of a ceramic or a composite of a metal and a ceramic.

The ceramic base 20 and the cooling plate 30 are bonded together through the bonding layer 40 by, for example, heat and pressure bonding of a laminated body obtained by adhering the ceramic base 20 to the cooling plate 30 before bonding via an adhesive layer such as an adhesive made of a resin, an adhesive sheet, a brazing filler metal, or a ceramic bond. The heat and pressure bonding is heating the laminated body at a predetermined temperature while applying pressure to the laminated body.

The wafer mount 10 further includes a first power feeder 50 that feeds power to the ESC electrode 21, and a second power feeder 60 that feeds power to the heater electrode 22.

The first power feeder 50 is disposed along the laminating direction of the ceramic base 20 and the cooling plate 30, and includes a feed terminal 51, an insulating component (sleeve) 52 surrounding the feed terminal 51, and a connector 53 disposed on one end of the feed terminal 51 and connected to the ESC electrode 21. A predetermined range of the first power feeder 50 on the connector 53 side is buried and fastened into the ceramic base 20 and the base 30*a*, while the remaining portion of the first power feeder 50 penetrates a through hole 33 of the cooling plate 30 and is exposed outside on the other end side. Then, the feed terminal 51 is electrically connected, on the other end side, to an ESC power supply 70 placed outside.

When the ESC power supply 70 applies a DC voltage to the ESC electrode 21 through the feed terminal 51 and the connector 53 with a wafer being disposed on the mounting surface 20*a* of the ceramic base 20, the wafer is electrostatically attracted to the mounting surface 20*a*.

Furthermore, the second power feeder 60 includes a feed terminal 61, an insulating component (sleeve) 62 surrounding the feed terminal 61, and a connector 63 disposed on one end of the feed terminal 61 and connected to the heater electrode 22. A predetermined range of the second power feeder 60 on the connector 63 side is buried and fastened into the ceramic base 20 and the base 30*a*, while the remaining portion of the second power feeder 60 penetrates a through hole 34 of the cooling plate 30 and is exposed outside on the other end side. Then, the feed terminal 61 is electrically connected, on the other end side, to a heater power supply 80 placed outside.

When the heater power supply 80 energizes the heater electrode 22 through the feed terminal 61 and the connector 63, the wafer mount 10 and further a wafer are heated.

Furthermore, a coolant entrance 35 penetrates the lid 30*b* at a predetermined position which communicates with the flow path 31 while the lid 30*b* is fixed to the base 30*a*. Although FIG. 1 illustrates only the single coolant entrance 35 to simplify the drawing, the coolant entrances 35 are actually formed at both ends of each of the grooves of the flow path 31. Each of the coolant entrances 35 is connected to a chiller unit 90 that cyclically supplies the coolant to the flow path 31.

A fin 32 is formed to protrude from at least one portion of the flow path 31. The fin 32 has a function of increasing a flow rate of the coolant at the disposed portion, thereby to locally increase the cooling efficiency. The shape and the size of the fin 32 are appropriately determined depending on a cooling state required for the disposed portion. The fin 32 may be made of a material identical to or different from that of the cooling plate 30. There may be a case that the fin 32 is not provided.

The wafer mount 10 with the aforementioned structure can heat a wafer to have a predetermined temperature distribution, by balancing heating and cooling the wafer through heating by energization to the heater electrode 22 and cyclically supplying the coolant to the flow path 31 simultaneously, with the wafer disposed on the mounting surface 20*a* being fixed via electrostatic attraction with application of a voltage to the ESC electrode 21.

The wafer mount 10 can be manufactured in a procedure of, for example, preparing the ceramic base 20 in which the ESC electrode 21 and the heater electrode 22 are buried, the base 30*a*, and the lid 30*b*, bonding the ceramic base 20 and the base 30*a* together through the bonding layer 40, then burying the first power feeder 50 and the second power feeder 60, and lastly attaching the lid 30*b* on the base 30*a*.

The ceramic base 20 is produced by, for example, hot-press sintering a green sheet laminated body formed by adhesively laminating a plurality of ceramic green sheets including a ceramic green sheet on which electrode patterns for the ESC electrode 21 have been print formed and a ceramic green sheet on which electrode patterns for the heater electrode 22 have been print formed.

Furthermore, the base 30*a* and the lid 30*b* of the cooling plate 30 can be produced by cutting a bulk metal, or gel-casting or other casting methods. In the base 30*a*, the recess 30*c* and the flow path 31 are formed, and the fin 32 is further formed to protrude from a predetermined position. The lid 30*b* includes the through hole 33, the through hole 34, and the coolant entrance 35. Each of the base 30*a* and the lid 30*b* includes screw holes, which are not illustrated, to be used for fixing the lid 30*b* to the base 30*a* through the screws.

Furthermore, a joint of the ceramic base 20 and the base 30*a* includes holes (burying holes) for burying the first power feeder 50 and the second power feeder 60. The burying holes may be separately formed in each of the ceramic base 20 and the base 30*a* before bonding so that the burying holes communicate with each other after bonding.

After the first power feeder 50 and the second power feeder 60 are buried into the ceramic base 20 in advance before bonding, the ceramic base 20 may be bonded to the base 30*a* with the first power feeder 50 and the second power feeder 60 being inserted into the through hole 33 and the through hole 34, respectively.

[Heat Uniformity Adjustment Treatment]

Figure 2:
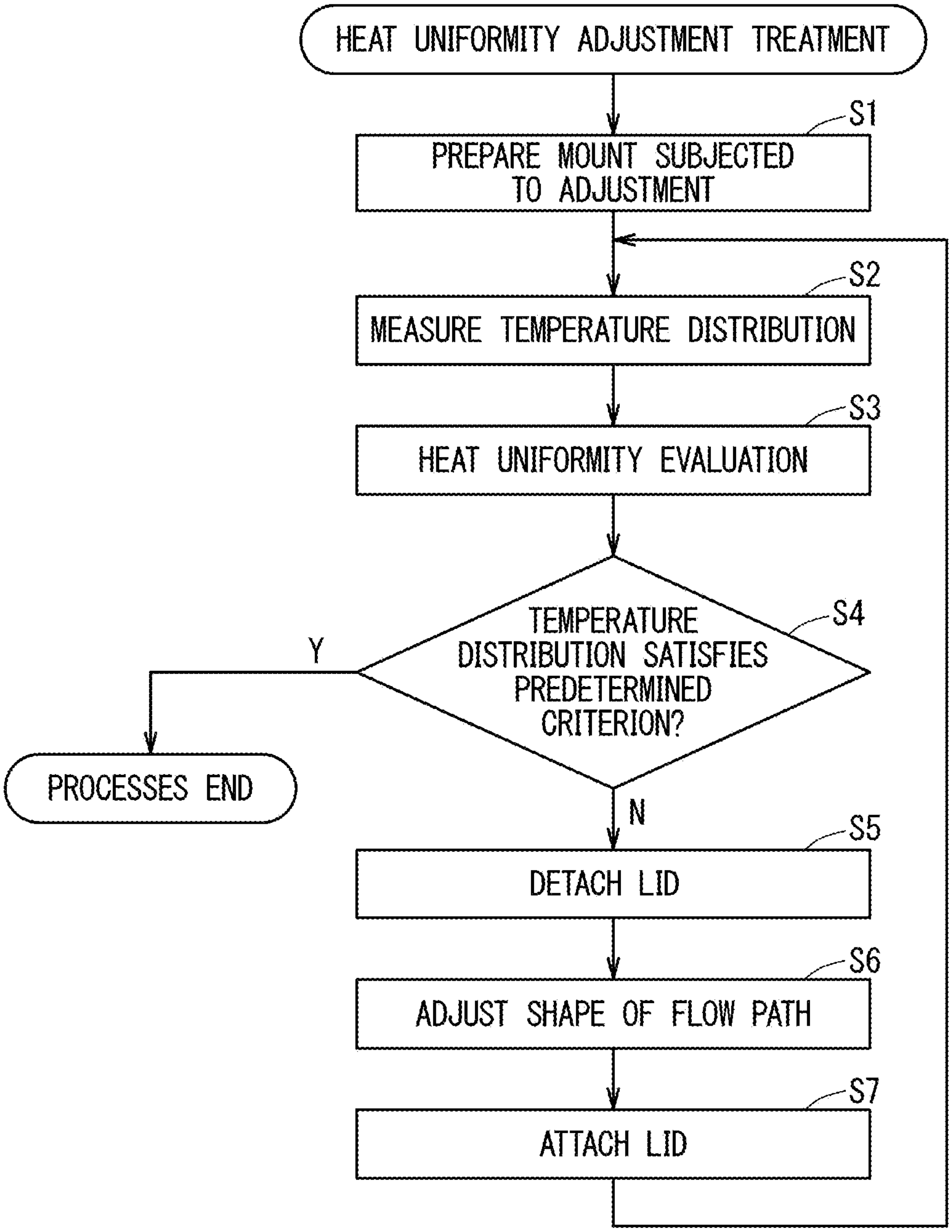
FIG. 2 illustrates a procedure for a heat uniformity adjustment treatment.

Next, the heat uniformity adjustment treatment to be applied to the wafer mount 10 according to the embodiment will be described. FIG. 2 illustrates a procedure for the heat uniformity adjustment treatment. The heat uniformity adjustment treatment is generally a treatment for improving temperature uniformity when the temperature distribution on the mounting surface 20*a* of the wafer mount 10 once produced does not satisfy desired heat uniformity.

First, the wafer mount 10, for example, produced in the aforementioned procedure and subjected to the adjustment is prepared (Step S1). Then, the temperature distribution on the mounting surface 20*a* for the wafer mount 10 is measured (Step S2).

Figure 3:
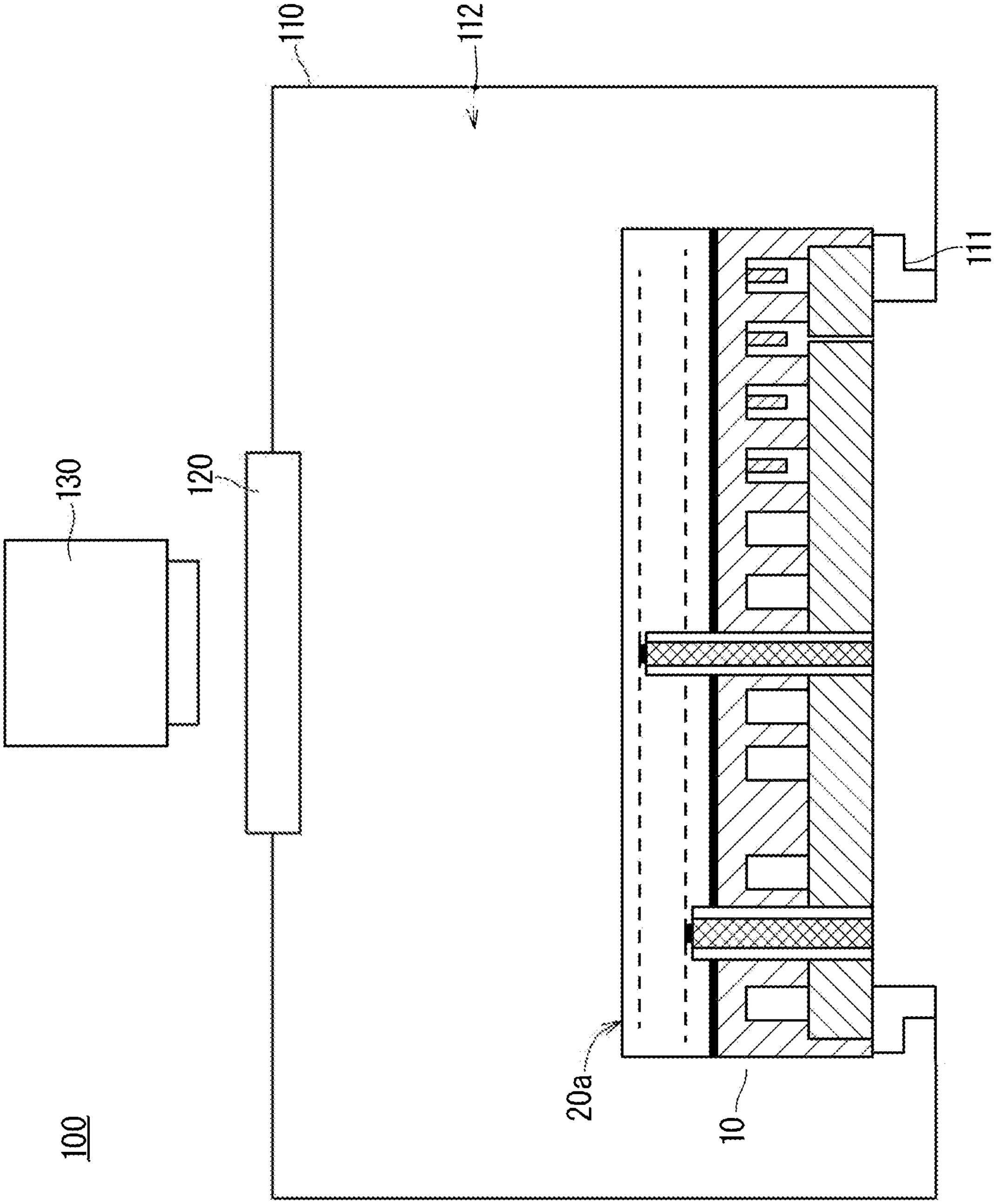
FIG. 3 schematically illustrates a structure of a temperature distribution measuring device 100.

FIG. 3 schematically illustrates a structure of a temperature distribution measuring device 100 to be used for measuring the temperature distribution on the mounting surface 20*a*.

The temperature distribution measuring device 100 includes a chamber 110 inside of which the wafer mount 10 to be measured is disposed. The chamber 110 includes a support mount 111 for supporting the wafer mount 10 from the bottom. The wafer mount 10 is supported by the support mount 111 with the mounting surface 20*a* having an attitude oriented vertically upward.

The chamber 110 includes a window 120 on a ceiling which faces the mounting surface 20*a* of the wafer mount 10, when the wafer mount 10 is supported by the support mount 111. The temperature distribution measuring device 100 further includes, outside of the chamber 110, an IR camera 130 that can capture images inside the chamber 110 through the window 120.

Although the illustration is omitted in FIG. 3, in the temperature distribution measuring device 100, the ESC power supply 70 can be connected to the first power feeder 50, the heater power supply 80 can be connected to the second power feeder 60, and the chiller unit 90 can be connected to the coolant entrance 35, with the wafer mount 10 being supported by the support mount 111.

In the temperature distribution measuring device 100 with such a structure, the IR camera 130 can capture images of the mounting surface 20*a* of the wafer mount 10 supported by the support mount 111, while the heater power supply 80 energizes the heater electrode 22 to heat the wafer mount 10 and the chiller unit 90 cyclically supplies the coolant to the flow path 31. In other words, the temperature distribution measuring device 100 can measure the temperature distribution on the mounting surface 20*a*. The temperature distribution measuring device 100 can obtain a result of the measurement as, for example, temperature mapping data.

After the temperature distribution measuring device 100 obtains the temperature distribution on the mounting surface 20*a*, a heat uniformity evaluation is conducted on the mounting surface 20*a* based on the result of the measurement (Step S3).

In the heat uniformity evaluation, it is determined whether the temperature distribution obtained through the measurement satisfies a predetermined criterion set in advance (Step S4). The criterion may be appropriately set according to, for example, the temperature distribution required for wafers. Examples of the criterion may include a criterion for determining whether local temperature variations in the obtained temperature distribution fall within a predetermined threshold range, and a criterion for determining whether a difference between the obtained temperature distribution and the temperature distribution intended when the wafer mount 10 has been designed falls within a predetermined threshold range.

When it is determined that the temperature distribution satisfies the predetermined criterion (YES in Step S4), the processes end at the point.

Figure 4:
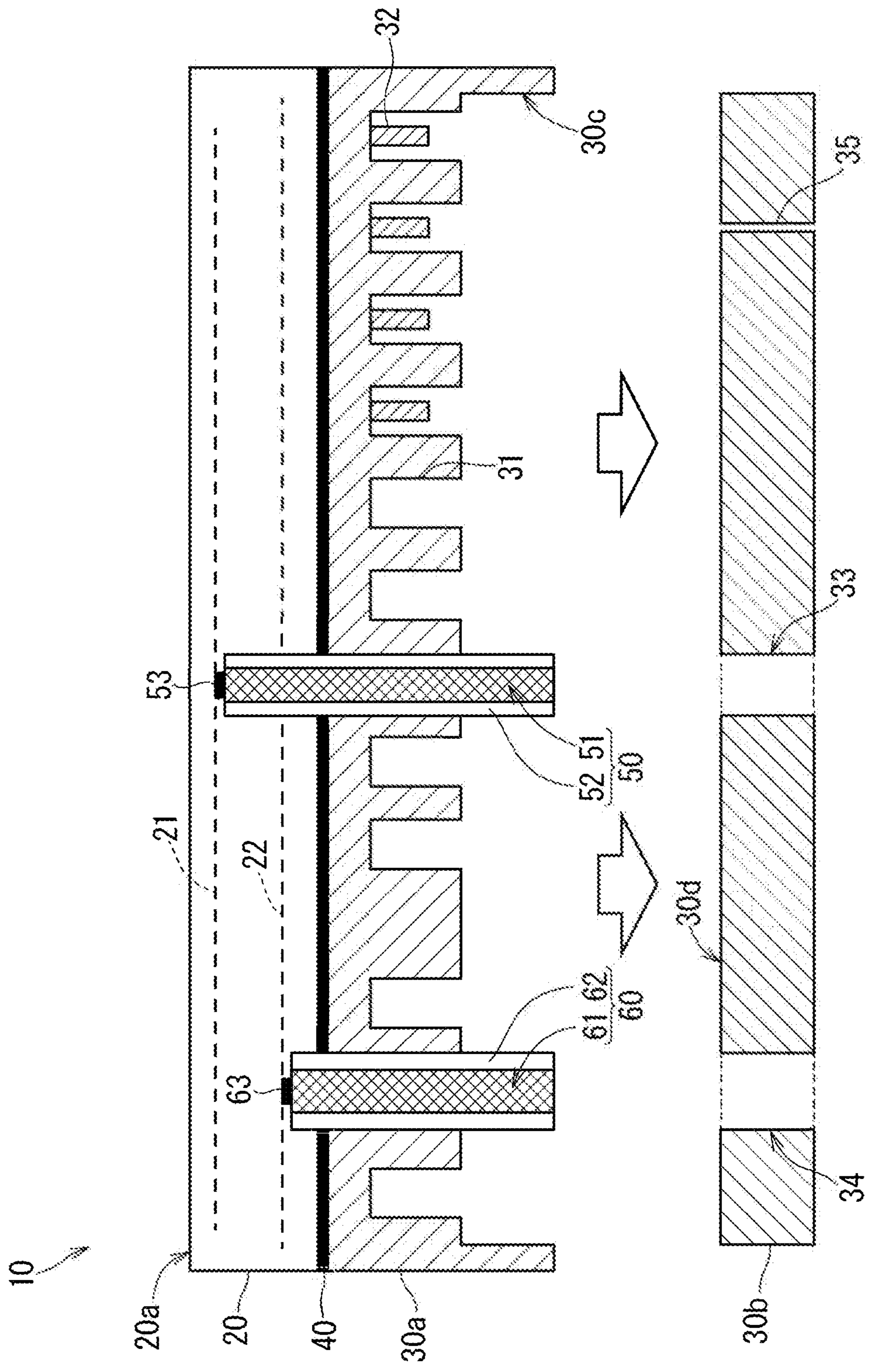
FIG. 4 illustrates a state of the flow path adjustment treatment stepwise.
Figure 5:
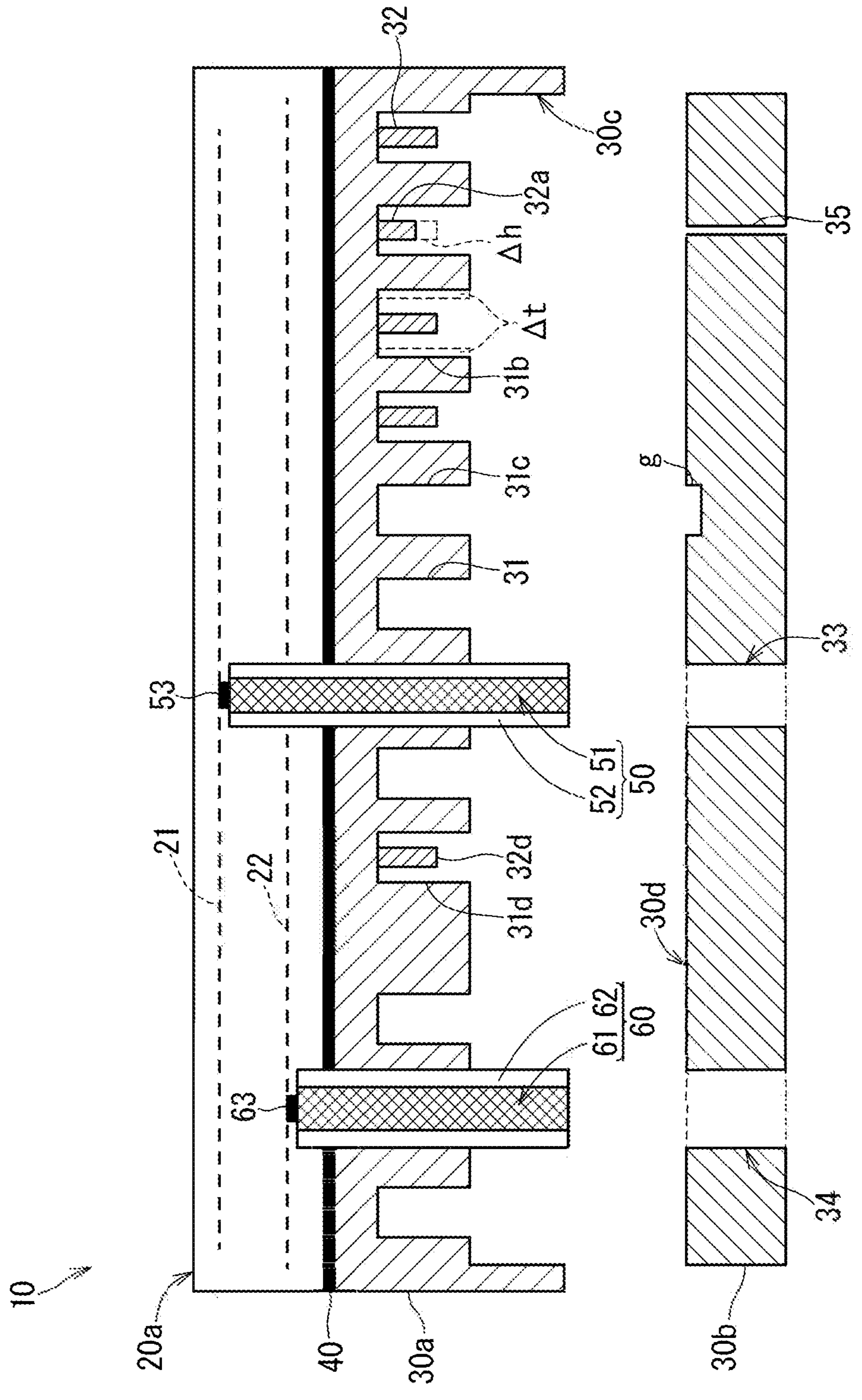
FIG. 5 illustrates a state of the flow path adjustment treatment stepwise.
Figure 6:
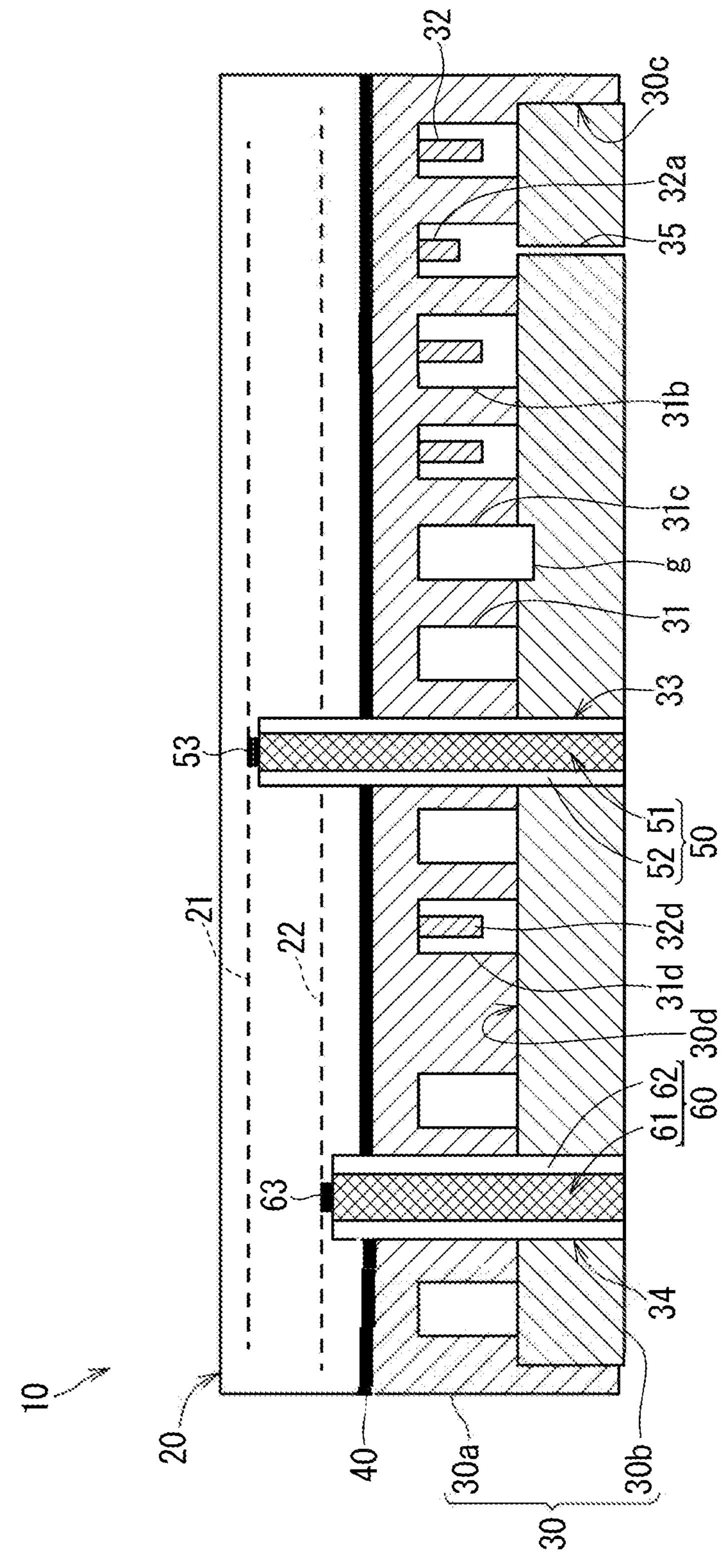
FIG. 6 illustrates a state of the flow path adjustment treatment stepwise.

When it is determined that the temperature distribution does not satisfy the predetermined criterion (NO in Step S4), a flow path adjustment treatment that is a treatment for locally adjusting the shape (typically the cross-sectional area) of the flow path 31 is applied so that the temperature distribution is improved, specifically, the heat extraction distribution by the cooling plate 30 is improved. FIGS. 4 to 6 illustrate states of the flow path adjustment treatment stepwise. The flow path adjustment treatment locally changes the flow of a coolant in an adjustment target portion.

Specifically, first, in the wafer mount 10 taken out from the temperature distribution measuring device 100, from which the heater power supply 80 and the chiller unit 90 have been disconnected, and in which the coolant has been removed from the flow path 31, the lid 30*b* is detached from the base 30*a* as illustrated in FIG. 4 (Step S5). This opens the flow path 31, and allows access to the flow path 31.

Next, the shape of the accessible flow path 31 is adjusted based on the result of the measurement on the temperature distribution (Step S6).

Specific adjustment methods include the following four methods (a) to (d). The adjustment is made using these methods (a) to (d) individually or in combination, according to a portion in which an improved temperature distribution is desired and a desired advantage (an increase or a decrease in temperature). FIG. 5 illustrates examples of the respective methods.

(a) Lower the height of the fin 32 in the flow path 31: Lowering the height of the fin 32 increases a cross-sectional area of the flow path 31 at a targeted portion where the fin 32 protrudes. This reduces the flow rate of the coolant at the targeted portion, and also reduces the heat extraction efficiency. Thus, the temperature of the mounting surface 20*a* in the vicinity of the targeted portion becomes higher than that before the adjustment. FIG. 5 exemplifies a case where the height of the fin 32 is lowered by Δh. Exemplifications of specific methods for lowering the height of the fin 32 include cutting the fin 32 and replacing the fin 32 with the fin 32 with a shorter length.

(b) Widen the flow path 31: Widening the flow path 31 increases the cross-sectional area of the flow path 31 in a targeted portion. This reduces the flow rate of the coolant, and also reduces the heat extraction efficiency. Thus, the temperature of the mounting surface 20*a* in the vicinity of the targeted portion becomes higher than that before the adjustment. FIG. 5 exemplifies a case where each side of a flow path 31*b* is widened by Δt. Exemplifications of specific methods for widening the flow path 31 include cutting each side of the flow path 31.

(c) Form an additional groove in a portion facing the flow path 31 on the main surface 30*d* of the lid 30*b*: Forming an additional groove in a targeted portion that faces the flow path 31 when the main surface 30*d* of the removed lid 30*b* is attached on the base 30*a* increases a cross-sectional area of the flow path 31 in the targeted portion, after the lid 30*b* is attached on the base 30*a* again. This reduces the flow rate of the coolant, and also reduces the heat extraction efficiency. Thus, the temperature of the mounting surface 20*a* in the vicinity of the targeted portion becomes higher than that before the adjustment. FIG. 5 exemplifies a case where an additional groove g is formed in a portion facing a flow path 31*c*. Exemplifications of specific methods for forming the additional groove include cutting and hammering.

(d) Add the fins 32 in the flow path 31: Newly forming the protruding fins 32 in a targeted portion without the fin 32 decreases the cross-sectional area of the flow path 31 in the targeted portion. This increases the flow rate of the coolant, and also increases the heat extraction efficiency. Thus, the temperature of the mounting surface 20*a* in the vicinity of the targeted portion becomes lower than that before the adjustment. The method (d) includes forming the fin 32 in the absence of any of the fin 32 protruding previously from the flow path 31. FIG. 5 exemplifies a case where a fin 32*d* is added to a flow path 31*d*.

Forming a pin shaped member instead of the fin 32 produces the same advantages as previously described. The fins 32 (or pins) to be added may be made of a material higher in thermal conductivity than that of the cooling plate 30 to increase the cooling efficiency. An appropriate material or shape should be selected according to a desired adjustment aspect (e.g., a varying degree of the temperature).

After the flow path 31 is adjusted based on the methods (a) to (d), the lid 30*b* is attached again to the base 30*a* as illustrated in FIG. 6 (Step S7). Then, measurement of the temperature distribution by the temperature distribution measuring device 100 (Step S2), and the heat uniformity evaluation based on the result of the measurement (Step S3) are performed again. When it is determined that the temperature distribution satisfies the predetermined criterion as a result of the heat uniformity evaluation (YES in Step S4), the processes end.

When it is determined in the heat uniformity re-evaluation that the temperature distribution does not satisfy the predetermined criterion (NO in Step S4), the flow path adjustment treatment, the temperature distribution measurement, and the heat uniformity evaluation are repeated until the temperature distribution finally satisfies the predetermined criterion.

According to the embodiment, in a wafer mount obtained by bonding together a ceramic base and a cooling plate, which can heat a wafer fixed on a mounting surface of the ceramic base via electrostatic attraction to have a predetermined temperature distribution by balancing heating the wafer through energization to a heater electrode buried in the ceramic base and cooling the wafer by cyclically supplying a coolant to the cooling plate, the cooling plate includes a base bonded to the ceramic base, and a lid detachable from the base, and detaching the lid can open a flow path through which the coolant flows, as described above. When the temperature distribution on the mounting surface does not satisfy a predetermined criterion, detaching the lid and adjusting the shape of the flow path can improve the temperature distribution. Enabling the adjustment of the temperature distribution on the wafer mount that has been manufactured can improving the manufacturing yields of the wafer mounts.

MODIFICATION

Although the temperature distribution on the mounting surface 20*a* on which no wafer is disposed is measured in the embodiment, instead, the temperature distribution on the surface of a wafer may be measured with the wafer being disposed on the mounting surface 20*a* and fixed on the mounting surface 20*a* via electrostatic attraction through application of a voltage from the ESC power supply 70. When the temperature distribution of the wafer mount to which the flow path adjustment treatment has been applied is remeasured, disposing the wafer is desired.

While the invention has been shown and described in detail, the foregoing description is in all aspects illustrative and not restrictive. It is therefore understood that numerous modifications and variations can be devised without departing from the scope of the invention.

What is claimed is:

1. A method of adjusting heat uniformity on a wafer mounting surface of a wafer mount, the wafer mount including:

a ceramic base which includes the wafer mounting surface and in which an electrostatic chucking electrode and a heater electrode are buried; and a cooling plate bonded to the ceramic base and including a flow path of a coolant, wherein the wafer mount is configured to perform heating through energization to the heater electrode and cooling by cyclically supplying the coolant to the flow path, with the wafer being fixed on the wafer mounting surface via electrostatic attraction through application of a voltage to the electrostatic chucking electrode, the method comprising the steps of:

a) preparing the wafer mount including the cooling plate including: a base bonded to the ceramic base and including the flow path; and a lid detachable from the base and allowing opening of the flow path when being detached from the base;

b) measuring a temperature distribution on the wafer mounting surface with the lid being attached on the base while performing the heating through the energization and the cooling;

c) detaching the lid from the base and locally adjusting a shape of the flow path when the measured temperature distribution does not satisfy a predetermined criterion; and d) remeasuring the temperature distribution on the wafer mounting surface of the wafer mount in which the shape of the flow path has been adjusted in the step c), with the lid being attached on the base while performing the heating through the energization and the cooling, wherein the step c) and the step d) are repeated until the temperature distribution remeasured in the step d) satisfies the predetermined criterion.

2. The method according to claim 1, wherein the base of the wafer mount prepared in the step a) includes a fin protruding from at least one portion of the flow path.

3. The method according to claim 2, wherein at least one of the following steps is performed in the step c) at a predetermined position determined according to a result of the measured temperature distribution:

lowering a height of the fin:

widening the flow path:

forming an additional groove in a portion facing the flow path on a main surface of the lid: or adding a new fin to the flow path.

4. The method according to claim 3, wherein the new fin is made of a material higher in thermal conductivity than a material of the cooling plate when the new fin is added to the flow path in the step c).

5. The method according to claim 1, wherein at least one of the following steps is performed in the step c) at a predetermined position determined according to a result of the measured temperature distribution:

widening the flow path:

forming an additional groove in a portion facing the flow path on a main surface of the lid: or forming a fin protruding from at least one portion of the flow path.

6. A method of manufacturing a wafer mount, the wafer mount including:

a ceramic base which includes a wafer mounting surface and in which an electrostatic chucking electrode and a heater electrode are buried; and a cooling plate bonded to the ceramic base and including a flow path of a coolant, wherein the wafer mount is configured to perform heating through energization to the heater electrode and cooling by cyclically supplying the coolant to the flow path, with the wafer being fixed on the wafer mounting surface via electrostatic attraction through application of a voltage to the electrostatic chucking electrode, the method comprising the steps of:

a) bonding together the ceramic base and a base of the cooling plate, the base including a groove to be the flow path;

b) burying, into a joint of the ceramic base and the base, a first power feeder that feeds power to the electrostatic chucking electrode, and a second power feeder that feeds power to the heater electrode;

c) detachably attaching a lid of the cooling plate on the base to close the flow path;

d) measuring a temperature distribution on the wafer mounting surface with the lid being attached on the base while performing the heating through the energization and the cooling;

e) detaching the lid from the base and locally adjusting a shape of the flow path when the measured temperature distribution does not satisfy a predetermined criterion; and f) remeasuring the temperature distribution on the wafer mounting surface of the wafer mount in which the shape of the flow path has been adjusted in the step e), with the lid being attached on the base while performing the heating through the energization and the cooling, wherein the step e) and the step f) are repeated until the temperature distribution remeasured in the step f) satisfies the predetermined criterion.

7. The method according to claim 6, wherein a fin protruding from at least one portion of the flow path is formed at latest before performing the step c).

8. The method according to claim 7, wherein at least one of the following steps is performed in the step e) at a predetermined position determined according to a result of the measured temperature distribution:

lowering a height of the fin:

widening the flow path:

forming an additional groove in a portion facing the flow path on a main surface of the lid: or adding a new fin to the flow path.

9. The method according to claim 8, wherein the new fin is made of a material higher in thermal conductivity than a material of the cooling plate when the new fin is added to the flow path in the step e).

10. The method according to claim 6, wherein at least one of the following steps is performed in the step e) at a predetermined position determined according to a result of the measured temperature distribution:

widening the flow path:

forming an additional groove in a portion facing the flow path on a main surface of the lid: or forming a fin protruding from at least one portion of the flow path.

* * * * *